United States Patent [19]
Ochi et al.

[11] Patent Number: 5,708,293
[45] Date of Patent: Jan. 13, 1998

[54] LEAD FRAME AND METHOD OF MOUNTING SEMICONDUCTOR CHIP

[75] Inventors: Takao Ochi, Shiga; Hisashi Funakoshi, Osaka; Ichiro Okumura, Kyoto; Hajime Honma, Osaka; Keiji Okuma, Osaka; Keiichi Fujimoto, Osaka, all of Japan

[73] Assignee: Matsushita Electronics Corporation, Osaka, Japan

[21] Appl. No.: 777,495

[22] Filed: Dec. 30, 1996

[30] Foreign Application Priority Data

Jan. 5, 1996 [JP] Japan .................................. 8-000129

[51] Int. Cl.$^6$ ............................................ H01L 23/495
[52] U.S. Cl. ........................ 257/666; 257/676; 257/669; 257/727
[58] Field of Search .......................... 257/666, 676, 257/669, 726, 727; 437/206, 217, 220, 209

[56] References Cited

U.S. PATENT DOCUMENTS 5,461,258  10/1995  Ideta et al. .................. 257/727
5,536,969   7/1996  Matsuoka .................... 257/666
5,559,364   9/1996  Hojyo ......................... 257/666

FOREIGN PATENT DOCUMENTS 2-278857  11/1990  Japan .
3-289163  12/1991  Japan .
4-317363  11/1992  Japan .

Primary Examiner—Mahshid D. Saadat
Assistant Examiner—S. V. Clark
Attorney, Agent, or Firm—McDermott, Will & Emery

[57] ABSTRACT

In a unit part of a lead frame for mounting a semiconductor chip, connecting leads and supporting leads extending from a lead frame main body toward a semiconductor chip mounting region are formed. Between each supporting lead and the lead frame main body, a movable part and a spring part for elastically supporting the movable part are disposed. The tip portion of the supporting lead connected with the movable part extends to the inside of the semiconductor chip mounting region in the natural state of the movable part, so that the tip portion butts against the side face of a semiconductor chip when the semiconductor chip is mounted. Thus, the semiconductor chip can be supported and fixed by using a bias force applied by the spring part. The base portions of the supporting leads, the movable part and the spring part do not remain in a package, and hence do not cause a stress in the package and do not increase the volume of the package. Thus, the invention provides a lead frame for forming a LOC package with high reliability which can contain a semiconductor chip having a large area within a regulated volume.

16 Claims, 17 Drawing Sheets

LEAD FRAME AND METHOD OF MOUNTING SEMICONDUCTOR CHIP

BACKGROUND OF THE INVENTION

The present invention relates to a lead frame for use in a resin sealed semiconductor package and a method of mounting a semiconductor chip using the lead frame.

In accordance with recent downsizing of electric equipment and their highly improved performance, there is a demand for a more compact, thinner and lighter semiconductor package suitable for high density mounting. In particular in the field of general memories, the outside dimension of a package is regulated in accordance with an industrial standard such as JEDEC and EIAJ, while a semiconductor chip has been increased in size by each generation. Therefore, it has been a significant problem how a large semiconductor chip having an increased area is contained in a package having a regulated dimension.

As an advantageous compact package for containing a chip having a large area, a LOC package was proposed and has now been mainly used.

The conventional LOC package will now be described with reference to FIGS. 16 and 17(a) through 17(e). FIG. 16 is a sectional view for showing the structure of the conventional LOC package, and FIGS. 17(a) through 17(e) are sectional views for showing procedures for manufacturing the LOC package.

As is shown in FIG. 16, the LOC package includes a bonding pad 25 of an Al electrode not at the periphery of a semiconductor chip 21 but at the center of the main face of the semiconductor chip 21. A polyimide tape 24 is adhered onto the semiconductor chip 21, and a lead 23 of a lead frame 30 is adhered onto the polyimide tape 24. The tip of the lead 23 extends to the vicinity of the bonding pad 25, and the lead 23 and the bonding pad 25 are connected with each other through a Au wire 29. Specifically, the structure of the LOC package is characterized mainly by the following: The lead frame 30 is provided with no die pad; the bonding pad 25 is disposed not at the periphery of the semiconductor chip 21 but at the center thereof and the tip of the lead 23 reaches the main face of the semiconductor chip 21; and the main face of the semiconductor chip is adhered to the tip of the lead 23 through the polyimide tape 24 interposed therebetween. As the polyimide tape 24, a tape bearing a thermoplastic adhesive agent on both surfaces is generally used.

Owing to this structure, the tip of the lead 23 can be extended to reach the main face of the semiconductor chip 21 so as to be bonded through a wire in this LOC package. Accordingly, there is no need to separately provide a space for wire bonding in the periphery of the semiconductor chip 21. Thus, the entire area occupied by the package can be decreased, and this enables a semiconductor chip having a large area to be contained in a compact package.

Now, the manufacturing procedures for the LOC package will be described with reference to FIGS. 17(a) through 17(e).

First, as is shown in FIG. 17(a), the lead frame 30 on which the polyimide tape 24 is adhered is aligned with the semiconductor chip 21. Then, as is shown in FIG. 17(b), the thermoplastic adhesive agent on the polyimide tape 24 is melted with a pressure heating tool (not shown), thereby adhering the lead frame 30 onto the semiconductor chip 21 through thermocompression bonding. Next, as is shown in FIG. 17(c), the tip of the lead 23 is bonded with the bonding pad 25 on the semiconductor chip 21 through the Au wire 29. Then, as is shown in FIG. 17(d), the semiconductor chip 21, the tip of the lead 23 and the Au wire 29 are sealed with a sealing resin 22. Subsequently, as is shown in FIG. 17(e), a part of the lead frame 30 close to the main body thereof is cut off from the resin sealed part with merely a portion of the lead 23 left for forming an external lead of the lead 23.

This conventional LOC package, however, has the following problems because the tip of the lead is adhered onto the main face of the semiconductor chip by using the polyimide tape:

(1) The manufacture of the lead frame with the polyimide tape requires a high cost.

(2) Since the polyimide tape has a high hygroscopic property, a water content absorbed by the polyimide tape is vaporized during solder reflow and annealing, resulting in causing a crack or void.

(3) Since the tip portions of the respective leads 23 are connected through the polyimide tape with a high hygroscopic property, although the leads can be generally insulated, a leakage can be easily caused between the leads when water is absorbed.

(4) In mounting the semiconductor chip on the lead frame, a chip damage can be caused through a mounting load and heat because the lead frame is adhered onto the semiconductor chip by melting the thermoplastic adhesive agent applied on both surfaces of the polyimide tape.

SUMMARY OF THE INVENTION

The present invention was devised to overcome the aforementioned disadvantages, and the object is providing a lead frame applicable to a die-padless LOC package without using a polyimide tape, which can contain a large semiconductor chip with high reliability within a regulated volume, and a method of mounting a semiconductor chip using the lead frame.

In order to achieve the object, the present lead frame does not use a polyimide tape but uses a dummy lead, which is newly designated as a supporting lead. A semiconductor chip can be fixed on the lead frame by clipping the side faces of the semiconductor chip with the supporting leads.

Specifically, the present lead frame for use in a resin sealed die-padless semiconductor package comprises a lead frame main body surrounding a semiconductor chip mounting region for mounting a semiconductor chip; a plurality of connecting leads, each extending from the lead frame main body toward the semiconductor chip mounting region to be electrically connected with a part of the semiconductor chip; a plurality of supporting leads each having a base portion connected with the lead frame main body and a tip portion for clipping the semiconductor chip by butting against a side face of the semiconductor chip when the semiconductor chip is mounted; a movable part disposed between at least one of the supporting leads and the lead frame main body relatively movably against the lead frame main body; and a spring part disposed between the movable part and the lead frame main body for elastically supporting the movable part and, when the movable part is shifted from a natural state thereof, for applying to the movable part a bias force in a direction reverse to movement of the movable part, and the tip portion of the supporting lead connected with the movable part is positioned within the semiconductor chip mounting region in the natural state, is movable to be positioned out of the semiconductor chip mounting region in accordance with the movement of the movable part, and is adoptable to support the semiconductor chip by using the bias force of the spring part by butting against the side face of the semiconductor chip when the semiconductor chip is mounted.

Accordingly, with the tip portion of the supporting lead butting against the side face of the semiconductor chip, the bias force toward the semiconductor chip is applied to the tip portion of the supporting lead connected with the movable part by the spring part. As a result, the semiconductor chip can be supported and fixed in the semiconductor mounting region by the bias force of the spring part applied to the tip portion of the supporting lead without adhering the connecting lead on the semiconductor chip by using a polyimide tape. Thus, it is possible to realize a die-padless lead frame to be packaged with a semiconductor chip without conducting a heating process and using a polyimide tape. In addition, since the base portions of the supporting leads and the movable part and the spring part connected with the base portions do not remain in the sealing resin, a stress due to the bias force of the spring part also does not remain in the semiconductor package, resulting in improving the reliability. Furthermore, an area occupied by a part to be sealed within the resin of the lead frame can be decreased, and hence, the volume of the semiconductor chip containable in a regulated volume can be increased.

In one aspect, the movable part can be provided with an engaging portion to be engaged with a member for moving the movable part.

In another aspect, when the member for moving the movable part is a pin, the engaging portion can be an opening to be engaged with the pin.

Accordingly, the semiconductor chip can be smoothly supported and fixed with the supporting leads by moving the movable part in mounting the semiconductor chip on the lead frame.

In still another aspect, the supporting leads can be disposed at two opposing portions of the lead frame for clipping two opposing side faces of the semiconductor chip, and the movable part can be disposed between the lead frame main body and the base portions of the supporting leads disposed at each of the two opposing portions.

Accordingly, the bias force of the spring part for clipping the semiconductor chip can be obtained on both sides of the semiconductor chip, and hence, the semiconductor chip can be stably fixed.

In still another aspect, the supporting leads can be disposed at two opposing portions of the lead frame for clipping two opposing side faces of the semiconductor chip, and the movable part can be disposed between the lead frame main body and the base portions of the supporting leads disposed at one of the two opposing portions with no movable part disposed between the lead frame main body and the base portions of the supporting leads disposed at the other of the two opposing portions, and the tip portions of the supporting leads disposed at the other of the two opposing portions accord with one end of the semiconductor chip mounting region.

Accordingly, it is possible to form a passage for the sealing resin in an area where the movable part is not disposed, and hence, the flow of the sealing resin can be prevented from being disturbed. Also, when an opening or the like is formed in the movable part, no runner remains in the opening, resulting in smoothing procedures after the resin sealing.

In still another aspect, a plurality of the supporting leads are disposed at each of the two opposing portions.

Accordingly, the semiconductor chip can be more stably supported.

In still another aspect, the tip portion of each supporting lead is preferably bent to lie along the side face of the semiconductor chip.

In still another aspect, the supporting leads can be disposed in an upstream area and a downstream area of a flow of the resin in a resin sealing process for sandwiching the semiconductor chip mounting region, and the spring part can have a structure for applying the bias force in a direction substantially parallel to a direction of the flow of the resin.

Accordingly, the semiconductor chip can be prevented from being moved by the flow of the sealing resin.

In still another aspect, the spring part can include a plurality of linear spring leads extending in a parallel direction to each other.

Owing to the spring leads, a reaction force from the semiconductor chip applied to the spring part can be balanced, resulting in stabilizing the support and fixation of the semiconductor chip with the supporting lead.

In still another aspect, the spring part can be formed by a slit pattern formed in the lead frame.

Accordingly, the spring part can be easily formed by merely stamping the lead frame. In addition, since the area occupied by the slit pattern is small, it is possible to suppress the increase of the entire area of the lead frame owing to the spring part.

The method of mounting a semiconductor chip of this invention comprises the steps of preparing a semiconductor chip; preparing a lead frame including a plurality of connecting leads extending from a lead frame main body toward a semiconductor chip mounting region, a plurality of supporting leads each having a base portion connected with the lead frame main body and a tip portion extending toward the semiconductor chip mounting region, a movable part disposed between at least one of the supporting leads and the lead frame main body relatively movably against the lead frame main body, and a spring part disposed between the movable part and the lead frame main body for elastically supporting the movable part, and when the movable part is shifted from a natural state thereof, for applying to the movable part a bias force in a direction reverse to movement of the movable part; positioning the tip portion of the supporting lead connected with the movable part out of the semiconductor chip mounting region by moving the movable part of the lead frame in a direction away from the semiconductor chip mounting region; with the tip portion of the supporting lead connected with the movable part positioned out of the semiconductor chip mounting region, setting the semiconductor chip in the semiconductor chip mounting region to be disposed below the connecting leads, and aligning the semiconductor chip and the lead frame main body for setting a vertical distance between the connecting leads and a main face of the semiconductor chip within a predetermined range; supporting the semiconductor chip by using the bias force of the spring part applied to the tip portion of the supporting lead by moving the supporting lead connected with the movable part in accordance with the bias force of the spring part until the tip portion of the supporting lead butts against a side face of the semiconductor chip; with the semiconductor chip supported by the supporting lead, electrically connecting the connecting leads with a part of the semiconductor chip and conducting resin sealing; and cutting off a part of each of the supporting leads extending from a predetermined position between the tip portion and the base portion toward the lead frame main body, a part of each of the connecting leads closer to the lead frame main body, the movable part, the spring part and the lead frame main body to be separated from a sealed part.

In one aspect of the method, the movable part can be provided with an opening in the step of preparing the lead frame; in the step of positioning the tip portion of the supporting lead by moving the movable part, a pin can be inserted through the opening and the pin is moved in the direction away from the semiconductor chip mounting region by supplying the inserted pin with a reaction force against the bias force of the spring part; and in the step of aligning the semiconductor chip and the lead frame main body, the reaction force against the bias force of the spring part can be released from the pin, and the pin can be pulled out of the opening after the tip portion of the supporting lead butts against the side face of the semiconductor chip.

By adopting this method, a semiconductor chip having a large area can be easily contained within a regulated volume by using the lead frame.

Figure 1:
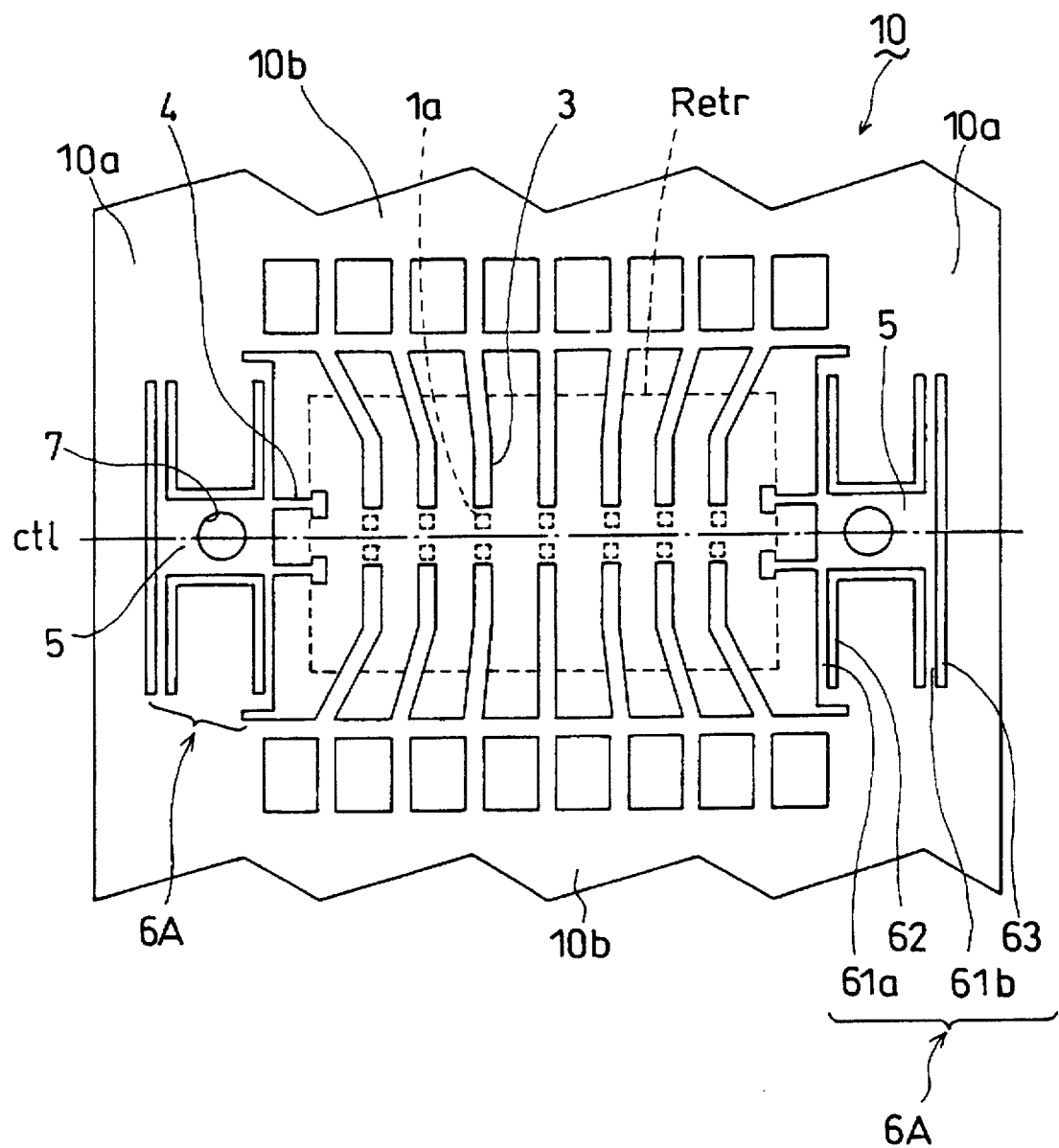
FIG. 1 is a plan view for showing the stamped shape of a lead frame according to a first embodiment of the invention.

DETAILED DESCRIPTION OF THE INVENTION (Embodiment 1)

The structure of a lead frame of the first embodiment will now be described with reference to FIGS. 1, 2(a), 2(b), 3(a) and 3(c). The main body of the lead frame 10 includes two first outer frames 10a parallel extending in the vertical direction in the drawings and two second outer frames 10b perpendicular to the first outer frames 10a. A unit part of this lead frame 10 for mounting a semiconductor chip has a symmetric structure about a center line Ctl parallel to the outer frames 10b. When the semiconductor chip is mounted, the center line Ctl of the unit part of the lead frame 10 accords with a center line, also parallel to the second outer frames 10b, of a semiconductor chip mounting region Retr, and a large number of bonding pads 1a (shown with virtual lines) on the main face of the semiconductor chip are aligned on both sides of and in the vicinity of the center line Ctl.

A large number of connecting leads 3 extend from the second outer frames 10b toward the center line Ctl of the unit part (i.e., toward the center line, parallel to the second outer frames 10b, of the semiconductor mounting region Retr). Each connecting lead 3 is connected with the second outer frame 10b at its base portion, and its tip portion reaches the vicinity of the corresponding bonding pad 1a of the semiconductor chip. Furthermore, a pair of supporting leads 4 extend, parallel to the center line Ctl, from each first outer frame 10a toward the semiconductor chip mounting region Retr for fixing the semiconductor chip. Each supporting lead 4 is connected with the first outer frame 10a at its base portion, and its tip portion reaches the inside of the semiconductor chip mounting region Retr. Between the base portions of each pair of supporting leads 4 and the first outer frame 10a, a movable part 5 connected with the base portions of the supporting leads 4 and a spring part 6A for elastically supporting the movable part 5 are disposed. The spring part 6A has a symmetric structure about the center line Ctl of the unit part of the lead frame 10, and includes first spring leads 61a and second spring leads 61b extending parallel to the first outer frame 10a and positioned on the respective sides of the center line Ctl. Additionally, a U-shaped slit 62 is formed on each side of the center line Ctl for forming the spring leads 61a and 61b, and a linear slit 63 parallel to the first outer frames 10a is further formed astride the center line Ctl.

In other words, a part of the lead frame 10 connected with the base portions of the supporting leads 4 is partitioned from the first outer frame 10a of the lead frame 10 by the U-shaped slits 62 and the linear slit 63, and this partitioning part works as the movable part 5. A portion of the movable part 5 closer to the supporting leads 4 and another portion thereof closer to the main body of the lead frame 10 are connected with the first outer frame 10a through the two first spring leads 61a and through the two second spring leads 61b, respectively on both sides of the center line Ctl. In this manner, each supporting lead 4 is movable together with the movable part 5 and is pushed toward the side face of the semiconductor chip 1 by the spring part 6A in this embodiment.

Furthermore, the spring part 6A of this embodiment includes the four linear first and second spring leads 61a and 61b extending parallel to one another and perpendicular to the supporting leads 4. In other words, the first spring leads 61a and the second spring leads 61b are disposed to be symmetrical to each other laterally along the center line Ctl, i.e., about a line perpendicular to the center line Ctl.

This movable part 5 is provided with a circular opening 7 to be engaged with a pin, which is a member for moving the movable part 5. Specifically, when the movable part 5 is moved to be away from the semiconductor chip mounting region Retr, namely, toward the outer frame 10a, with the pin engaged with the opening 7, the spring part 6A is shifted from its natural state.

Figure 2A:
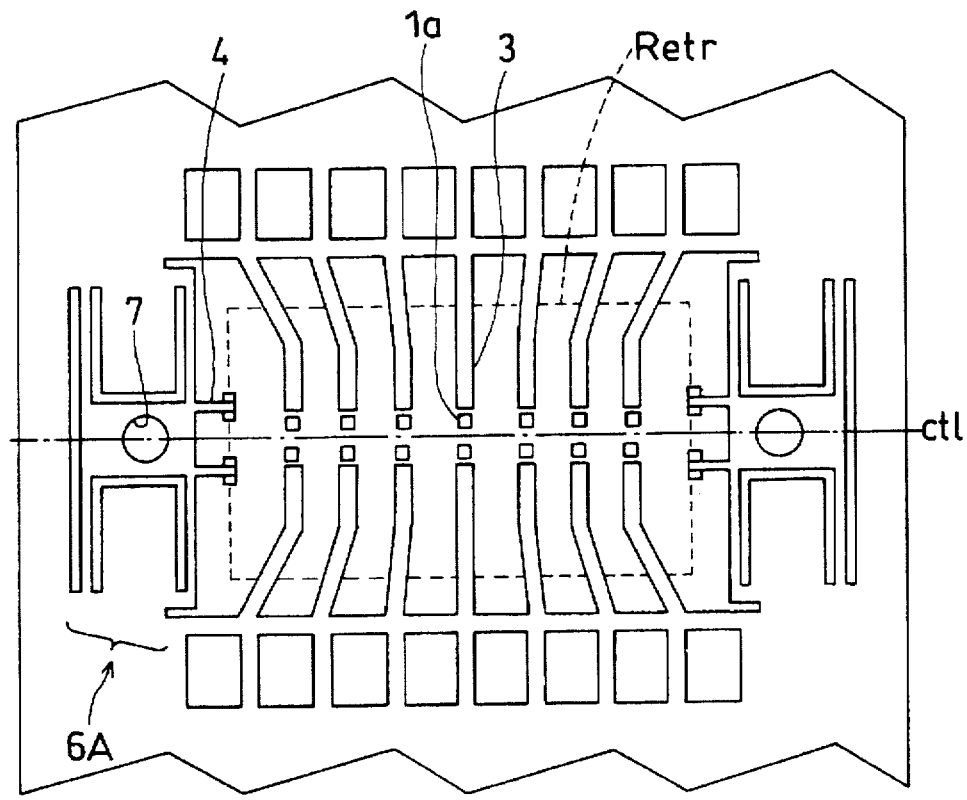
FIGS. 2(a) and 2(b) are respectively a plan view and a sectional view for showing the shape of the lead frame of the first embodiment in actual use.
Figure 2B:
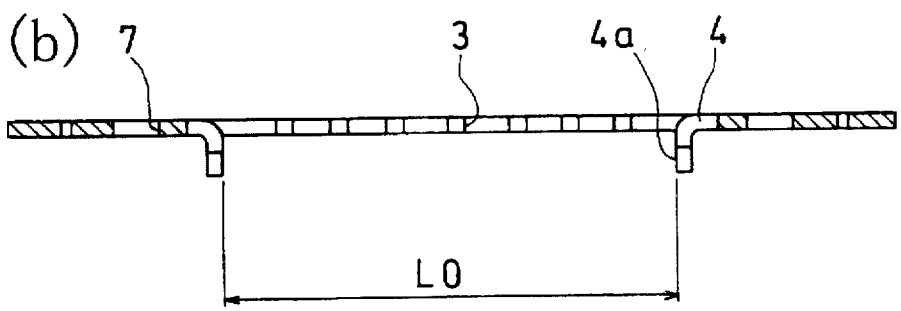

Subsequently, FIGS. 2(a) and 2(b) are respectively a plan view and a sectional view taken on the center line Ctl of the unit part for showing the state of the lead frame 10 before actually mounting the semiconductor chip thereon. In actual use, as is shown in FIGS. 2(a) and 2(b), the tip portions 4a of the supporting leads 4 are bent so as to lie along the side face of the semiconductor chip and the bent tip portions 4a are positioned within the semiconductor chip mounting region Retr. In other words, in the natural state while the spring part 6A is not working, a distance L0 between the opposing supporting leads 4 in the parallel direction to the center line Ctl is previously designed to be smaller than the length of the side face of the semiconductor chip parallel to the center line Ctl.

Figure 3A:
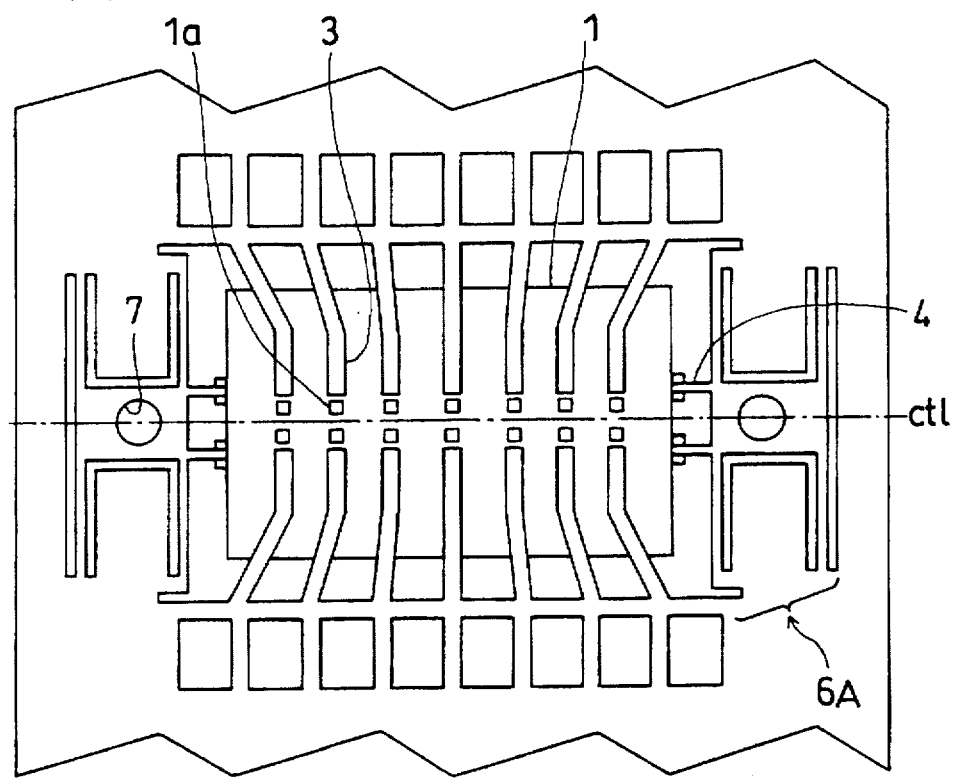
FIGS. 3(a) and 3(b) are respectively a plan view and a sectional view for showing the shape of the lead frame of the first embodiment in mounting a semiconductor chip thereon.
Figure 3B:
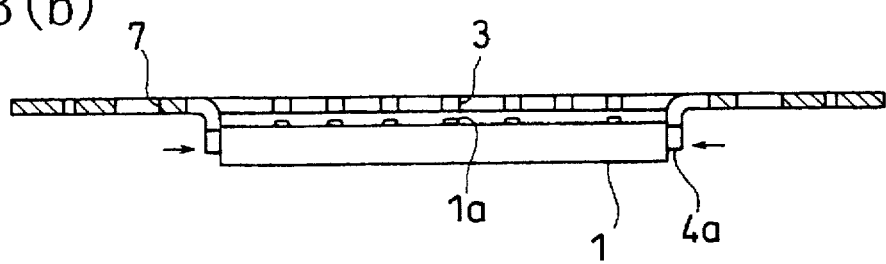

FIGS. 3(a) and 3(b) are respectively a plan view and a sectional view taken on the center line Ctl of the unit part for showing the state of the lead frame 10 mounting the semiconductor chip 1. In this state, the tip portion 4a of each supporting lead 4 is in contact with the side face of the semiconductor chip 1. Since each movable part 5 is shifted from the natural state at this point, a bias force in the direction reverse to the movement of the movable part 5 is caused in the spring part 6A. Accordingly, the tip portion 4a of each supporting lead 4 is pushed by the spring part 6A toward the semiconductor chip 1, and the semiconductor chip 1 can be supported by using this bias force.

Figure 4A:
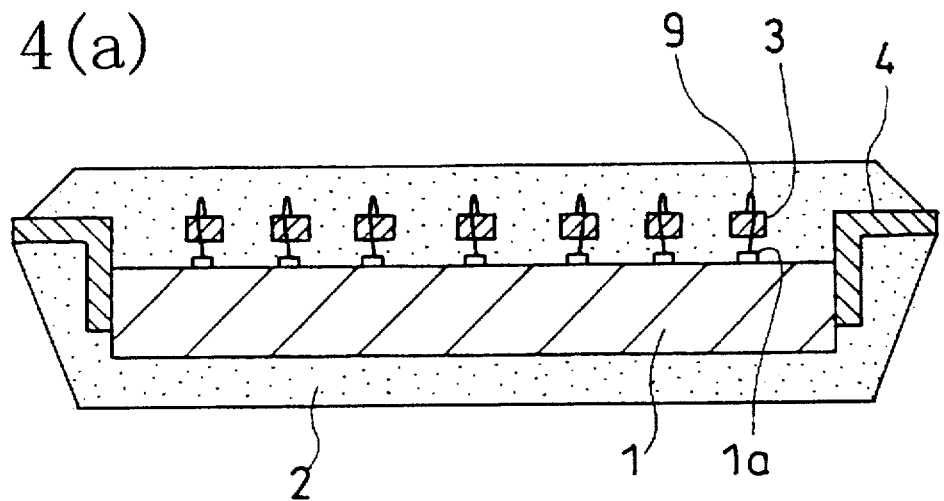
FIGS. 4(a) and 4(b) are sectional views taken on lines parallel and perpendicular to a direction for extending supporting leads of a resin sealed semiconductor package using the lead frame of the first embodiment, respectively.
Figure 4B:
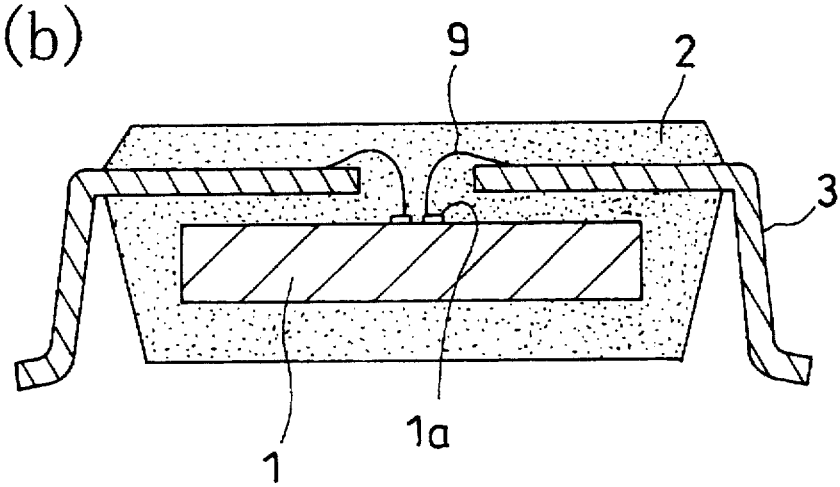

Next, the structure of a resin sealed semiconductor package using the lead frame 10 of this embodiment will now described with reference to FIGS. 4(a) and 4(b). FIGS. 4(a) and 4(b) are respectively a sectional view taken on a line substantially corresponding to the center line Ctl of the unit part of the lead frame 10 and a sectional view taken on a line perpendicular to the central line Ctl, whereas these drawings do not accurately show the sections because members which cannot be seen in these sections are also shown for facilitating the understanding.

As is shown in FIG. 4(a), a semiconductor chip 1 is embedded in a sealing resin 2 while being in contact with the respective tip portions 4a of the supporting leads 4 of the lead frame 10. However, the movable parts 5 and the spring parts 6A connected with the base portions of the supporting leads 4 are disposed out of the sealing resin 2, and are cut off after the formation of the package, and hence, the tip portions 4a of the supporting leads 4 are not supplied with the bias force by the spring parts 6A. Furthermore, each connecting lead 3 is bent outside of the sealing resin 2, and a portion thereof corresponding to an outer lead is cut off with a portion having a length required for electrical connection with external equipment (specifically, an internal lead) alone left. The semiconductor chip 1 and each connecting lead are away from each other with no polyimide tape interposed therebetween. In other words, the semiconductor chip 1 and the connecting leads 3 are ultimately fixed by being sealed with the sealing resin. Each bonding pad 1a of the semiconductor chip 1 is connected with the tip portion of the corresponding connecting lead 3 through a Au wire 9.

In this embodiment, the movable parts 5 connected with the base portions of the supporting leads 4 extending from the outer frames of the lead frame 10 are mostly separated from the surrounding outer frames 10a by the slit patterns, and are connected with the peripheral areas through the spring leads 61a and 61b. These spring leads 61a and 61b constitute the spring parts 6A for elastically supporting the movable parts 5. Accordingly, the movable parts 5 can be freely moved independently from the surrounding outer frames in a deformable range allowed by the spring elasticity of the spring leads 61a and 61b. In other words, the tip portions 4a of the supporting leads 4 disposed on both sides of the semiconductor chip mounting region Retr as is shown in FIG. 1 can be moved to be positioned in or out of the semiconductor chip mounting region Retr. Since the semiconductor chip 1 can be clipped by using the bias force of the spring parts 6A, the connecting leads and the bonding pads can be bonded with each other without interposing a polyimide tape between the connecting leads 3 and the semiconductor chip 1. Therefore, the aforementioned problems, such as the increase of the manufacturing cost, occurrence of a clack or void due to the hygroscopic property, a leakage between the leads, and a chip damage due to heat, can be avoided.

In addition, the spring parts 6a for supplying the bias force for clipping the semiconductor chip 1 with the supporting leads 4 are disposed between the base portions of the supporting leads 4 and the outer frames (i.e., the first outer frames 10a in this embodiment). Therefore, after the resin sealing, the spring parts 6A are cut off and do not remain in the sealing resin 2. Accordingly, a stress does not remain in the package after the resin sealing differently from the case where the semiconductor chip is supported by using a resiliency caused by elastically deforming the supporting leads themselves, and the volume of the sealed part can be prevented from increasing. Thus, not only the reliability can be improved, but also a semiconductor chip having a large area can be contained in a semiconductor package having a dimension regulated by the standard.

Also in this embodiment, among the four spring leads 61a and 61b constituting the spring part 6A, each pair of the spring leads, i.e., the spring leads 61a or 61b, are disposed to be symmetrical to each other about the central line Ctl. Therefore, the stress applied to the spring part 6A can be balanced without causing a torque on a horizontal plane in the spring part 6A. In addition, the pair of spring leads 61a closer to the supporting leads 4 and the pair of spring leads 61b closer to the first outer frame 10a are provided as each spring part 6A, and these pairs are disposed symmetrically to each other about the line perpendicular to the central line Ctl. As a result, the rotation of the spring part 6A around the line perpendicular to the central line Ctl can be suppressed as far as possible, so that the stress applied to the spring part 6A can be balanced. Specifically, by disposing the spring leads 61a and 61b as in this embodiment, it is possible to suppress wasteful and unpreferable behaviors of the movable part 5, such as upward and downward movement, twist, rotation and distortion against the horizontal plane of the lead frame 10, which can be otherwise caused by the movement of the springs or a stress applied for fixing the semiconductor chip. As a result, the state of the fixed semiconductor chip 1 can be prevented from being unstabilized as far as possible. Specifically, the positional relationship between the semiconductor chip 1 and the connecting leads 3 can be prevented from becoming inconstant, and the semiconductor chip 1 is prevented from moving in attaching the connecting leads 3 to the main face thereof for the wire bonding owing to an insufficient supporting force of the supporting leads 4.

In order to make the spring leads 61a and 61b exhibit satisfactory spring elasticity in the operational range of the spring parts 6A, it is preferred that the spring leads 61a and 61b are free from plastic deformation. This can be attained by optimizing the width and the length of each of the spring leads 61a and 61b. For example, in the case where the lead frame 10 is made of an alloy 42 and has a thickness of 150 μm, the ratio between the width and the length of each spring lead is required to be 1:14 or more when the operational range of the spring part 6A is set at 100 μm.

Furthermore, in order to prevent the spring part 6A from being caught by something and damaged during another process or the conveyance, the spring part 6A is preferably formed to be away from the outer edge of the lead frame 10 by 2 mm or more.

Moreover, in the spring part 6A of this embodiment, the opening 7 is formed at the center of the area separated from the base portions of the supporting leads 4, so that the pin 11 for moving the spring part 6A can be inserted through the opening 7. Thus, the spring part 6A can be opened and closed.

The length of each supporting lead 4 of the lead frame 10 is determined so that the distance L0 between the opposing bent tip portions can be smaller than the size of the semiconductor chip 1 as is shown in FIGS. 2(a) and 2(b). By thus designing the lead frame, the semiconductor chip 1 inserted between the supporting leads 4 can be supported by the supporting leads 4 and the movable parts 5 by using the bias force applied by the spring parts 6A. Specifically, the spring parts 6A supply the movable parts 5 and the supporting leads 4 for supporting the semiconductor chip 1 with the bias force corresponding to the elastic force of the spring parts 6A in proportion to a distance by which the supporting leads 4 are pushed outward by the reaction force from the semiconductor chip 1.

In the case where the supporting force of the supporting leads 4 for the semiconductor chip 1 is desired to be increased, the spring modulus of the spring parts 6A of the lead frame 10 is increased, or a difference between the size (the length of the side face parallel to the center line Ctl) of the semiconductor chip 1 and the distance L0 between the tip portions of the supporting leads 4 is increased. In contrast, in the case where the supporting force of the supporting leads 4 for the semiconductor chip 1 is desired to be decreased, the spring modulus of the spring parts 6A is decreased, or the difference between the size of the semiconductor chip 1 and the distance L0 between the tip portions of the supporting leads 4 is decreased. In such cases, the length of the supporting leads 4 and the spring modulus of the spring parts 6A can be optimized in view of the minimum supporting force required for fixing the semiconductor chip 1 in the wire bonding and the like, the maximum supporting force for not causing a damage in the semiconductor chip 1, the relationship between the supporting force and the warp of the lead frame 10 or the semiconductor chip 1, and the like. In this embodiment, the distance L0 between the tip portions of the supporting leads 4 in the natural state while the spring parts 6A are not working is set to be smaller than the size of the semiconductor chip 1 by approximately 0.1 mm.

The width of the slits 62 and 63 in the parallel direction to the center line Ctl is preferably determined to be larger than a moving distance of the spring part 6A in fixing the semiconductor chip 1. This is because it is necessary to take an error in the alignment between the lead frame 10 and the semiconductor chip 1 and the fluctuation in their dimensions and shapes into consideration. Therefore, in the embodiment, since the distance L0 between the tip portions of the supporting leads 4 in the natural state is smaller than the size of the semiconductor chip 1 by approximately 0.1 mm, the width of the slits 62 and 63 in the parallel direction to the center line Ctl is set to be 0.1 mm or more.

Also, the distance between each connecting lead 3 of the lead frame 10 and the main face of the semiconductor chip 1 is preferably 50 through 200 μm or smaller in view of a countermeasure against a harmful effect of a rays emitted by the connecting leads 3 on semiconductor elements in the semiconductor chip 1, minimization in the thickness of the package, necessity of retaining a heat radiating effect by the connecting leads 3, and the like.

Furthermore, in the lead frame 10 of this embodiment, each spring part 6A is formed by using the slit pattern, and hence, the following advantages can be attained:

1) The spring part 6A can be formed simultaneously with the manufacture of the lead frame 10 through etching and stamping procedures, resulting in decreasing the manufacturing cost.

2) Even though the spring part 6A is formed in the lead frame 10, since the lead frame 10 is free from surface irregularities and can be flat, the spring part 10 does not interfere the wire bonding and sealing procedures and the conveyance.

Now, procedures for mounting the semiconductor chip in the resin sealed semiconductor package using the lead frame 10 will be described with reference to FIGS. 5(a) through 5(d) and 6(a) through 6(c). FIGS. 5(a) through 5(d) and 6(a) through 6(c) are sectional views corresponding to FIG. 4(a), and these sectional views also do not accurately show the section.

Figure 5A:
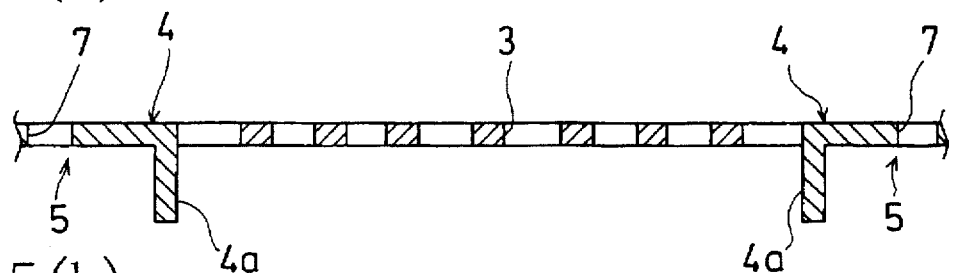
FIGS. 5(a) through 5(d) are sectional views for showing procedures for mounting a semiconductor chip, up to a procedure for supporting and fixing the semiconductor chip, adopted for manufacturing the resin sealed semiconductor package using the lead frame of the first embodiment.
Figure 5B:
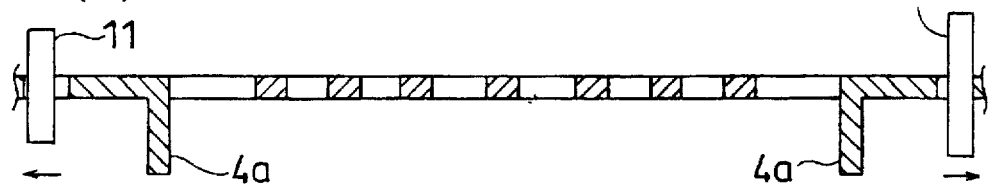

First, the tip portions 4a of the supporting leads 4 of the lead frame 10 are bent as is shown in FIG. 5(a), and two pins 11 are inserted through the openings 7 of the movable parts 5 and moved outward as is shown in FIG. 5(b). As a result, the tip portions 4a of the supporting leads 4 are positioned out of the semiconductor chip mounting region Retr.

Figure 5C:
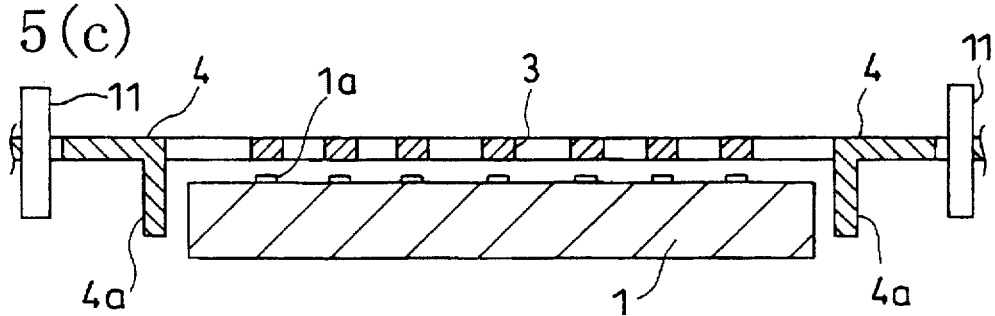
Figure 5D:
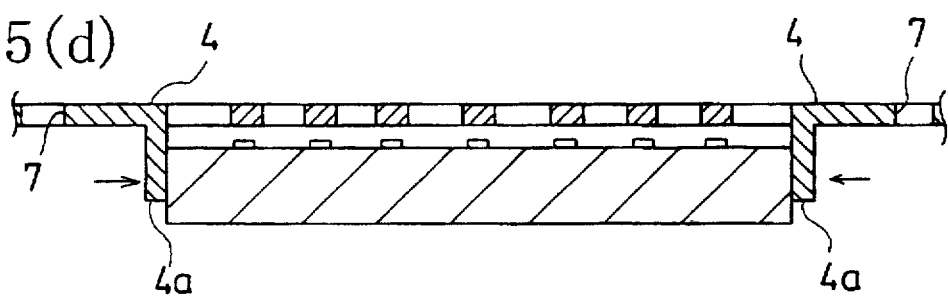

Then, the semiconductor chip 1 is set between the tip portions 4a of the supporting leads 4 as is shown in FIG. 5(c), and the pins 11 are moved in the reverse direction until the tip portions 4a of the supporting leads 4 butt against the side faces of the semiconductor chip 1 and then are pulled out of the openings 7, resulting in attaining a state shown in FIG. 5(d). At this point, nothing is disposed between each connecting lead 3 and the semiconductor chip 1.

Figure 6A:
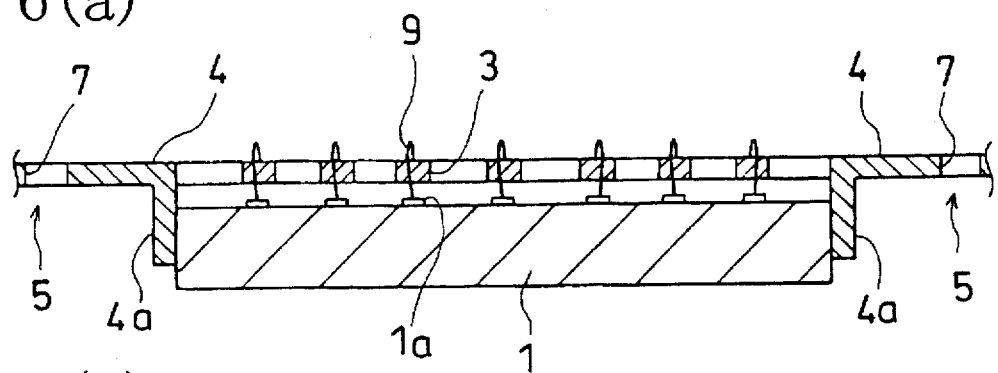
FIGS. 6(a) through 6(c) are sectional views for showing procedures, of wire bonding and thereafter, for mounting the semiconductor chip adopted for manufacturing the resin sealed semiconductor package using the lead frame of the first embodiment.

Next, the tip portion of each connecting lead 3 is electrically connected with each bonding pad 1a of the semiconductor chip 1 through the Au wire 9 as the wire bonding process as is shown in FIG. 6(a). At this point, since the connecting lead 3 is disposed above the semiconductor chip 1 with nothing interposed therebetween, the wire bonding process is conducted with the tip portion of the connecting lead 3 pressed down on the semiconductor chip 1 with a presser jig.

Figure 6B:
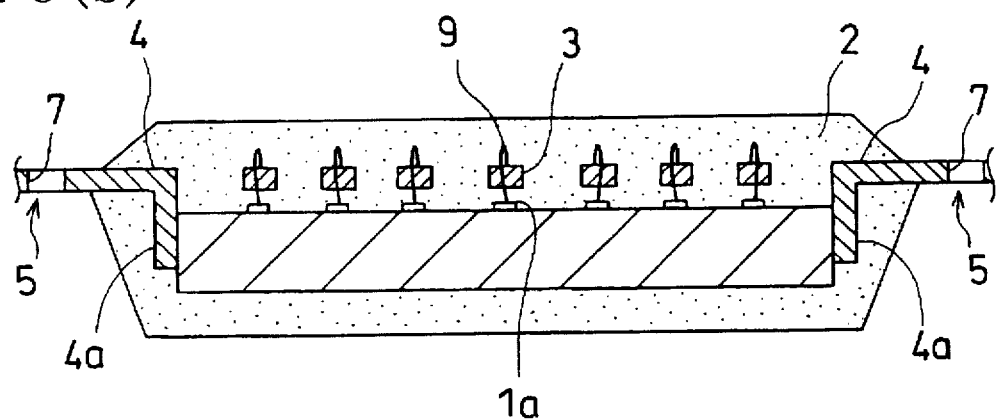
Figure 6C:
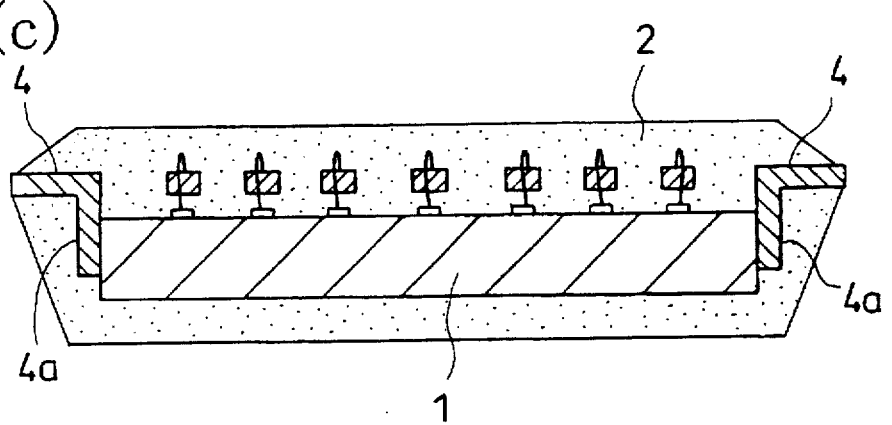

Then, the semiconductor chip 1, the bonding pads 1a, the tip portions of the connecting leads 3 and the Au wires 9 are sealed within the sealing resin 2 as is shown in FIG. 6(b). After the resin sealing, the base portions of the supporting leads 4 are cut off with the sealed portions within the sealing resin 2 left. At this point, the outer fames 10a and 10b, the movable parts 5, the spring parts 6A and the like of the lead frame 10 are also cut off, and none of these elements remains in the sealing resin 2. Specifically, in a state shown in FIG. 6(c), since the spring parts 6A do not remain in the sealing resin 2, the tip portions 4a of the supporting leads 4 have lost the bias force toward the side faces of the semiconductor chip 1, and the reaction force from the semiconductor chip 1 toward the tip portions 4a has also been lost.

In the aforementioned procedures, since the openings 7 are formed in the movable parts 5 in this embodiment, the spring parts 6A can be easily moved during the mounting procedures for the semiconductor chip. In this case, the diameter of each opening 7 is larger than the diameter of each pin 11 so as to provide play therebetween in this embodiment. As a result, in changing the state shown in FIG. 5(c) to the state shown in FIG. 5(d), the pins 11 can be slightly moved toward the semiconductor chip 1 after the tip portions 4a of the supporting leads 4 butt against the side faces of the semiconductor chip 1. In other words, the range of an appropriate position for pulling the pin 11 out of the opening 7 can be enlarged in accordance with the play between the pin 11 and the opening 7, resulting in smoothing the procedure.

Moreover, in the sealing procedure shown in FIG. 6(b), the direction of applying the bias force by the spring part 6A accords with the flowing direction of the sealing resin 2. Thus, the flow of the sealing resin 2 can be prevented from moving the semiconductor chip 1 in the direction perpendicular to the supporting force applied by the supporting leads 4.

(Embodiment 2)

Figure 7:
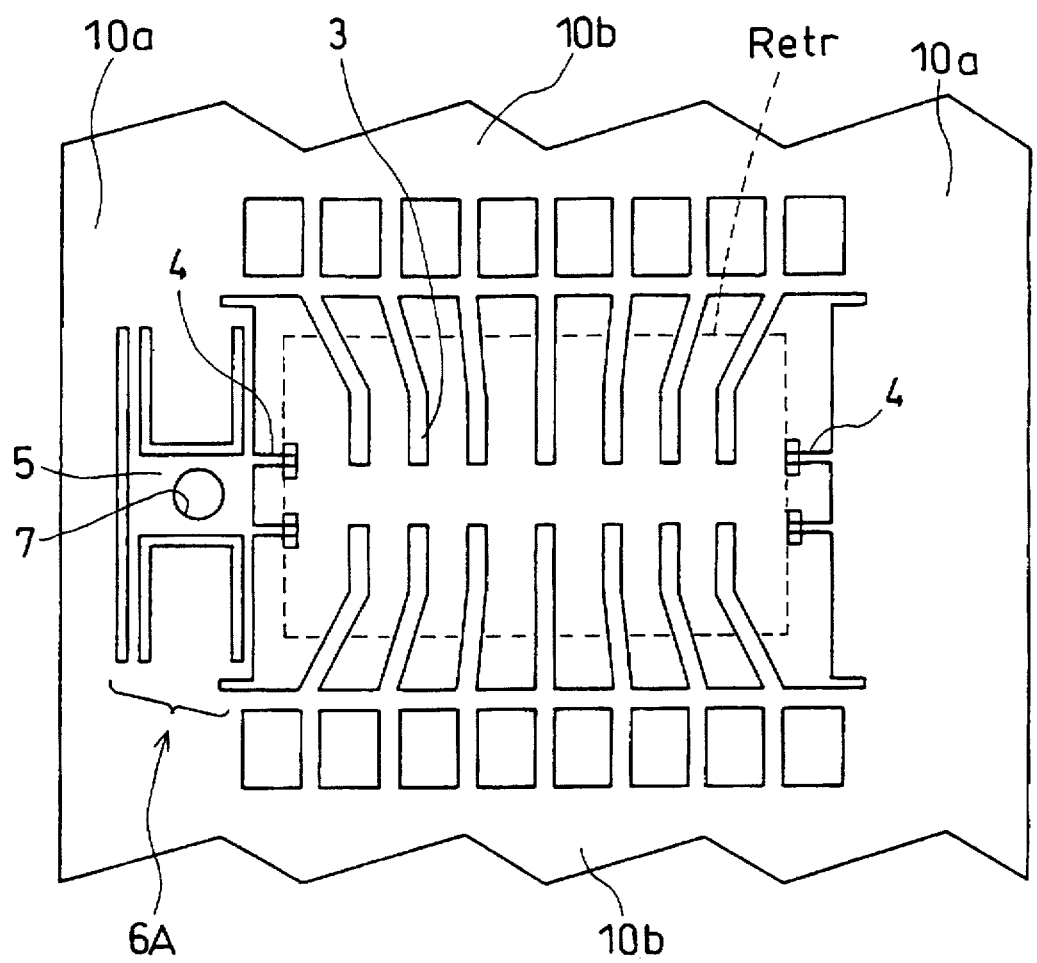
FIG. 7 is a plan view for showing the shape of a lead frame according to a second embodiment of the invention.

A second embodiment will now be described with reference to FIG. 7. FIG. 7 is a plan view of a lead frame of this embodiment, wherein tip portions 4a of suspending leads 4 are bent.

As is shown in FIG. 7, a spring part 6A and a movable part 5 respectively having the same structures as described in the first embodiment are provided between one first outer frame 10a and one pair of supporting leads 4 among two pairs for sandwiching a semiconductor chip 1 in this embodiment. In contrast, neither a spring part 6A nor a movable part 5 is disposed between the other pair of supporting leads 4 and the other outer frame 10a. The tip portions 4a of the supporting leads 4 connected with the movable part 5 at their base portions extend to the inside of a semiconductor mounting region Retr, but the tip portions 4a of the supporting leads 4 directly connected with the outer frame 10a at their base portions only extend to accord with one end of the semiconductor chip mounting region Retr.

As will be understood easily, this second embodiment also attains the same effects as those attained by the first embodiment. In addition, it is possible to avoid an opening 7 being formed in a so-called runner remaining in a passage and the like for supplying a sealing resin from the side closer to the supporting leads 4 directly connected with the first outer frame 10a. When the opening of the lead frame 10 is formed in the runner, the sealing resin can remain in the opening, and this can complicate subsequent procedures such as a procedure for separating the sealing resin from a cut portion of the lead frame 10. This embodiment can avoid the complication of the subsequent procedures. Furthermore, since no opening of the lead frame is positioned in the passage of the sealing resin, the resin can flow more smoothly.

(Embodiment 3)

Figure 8:
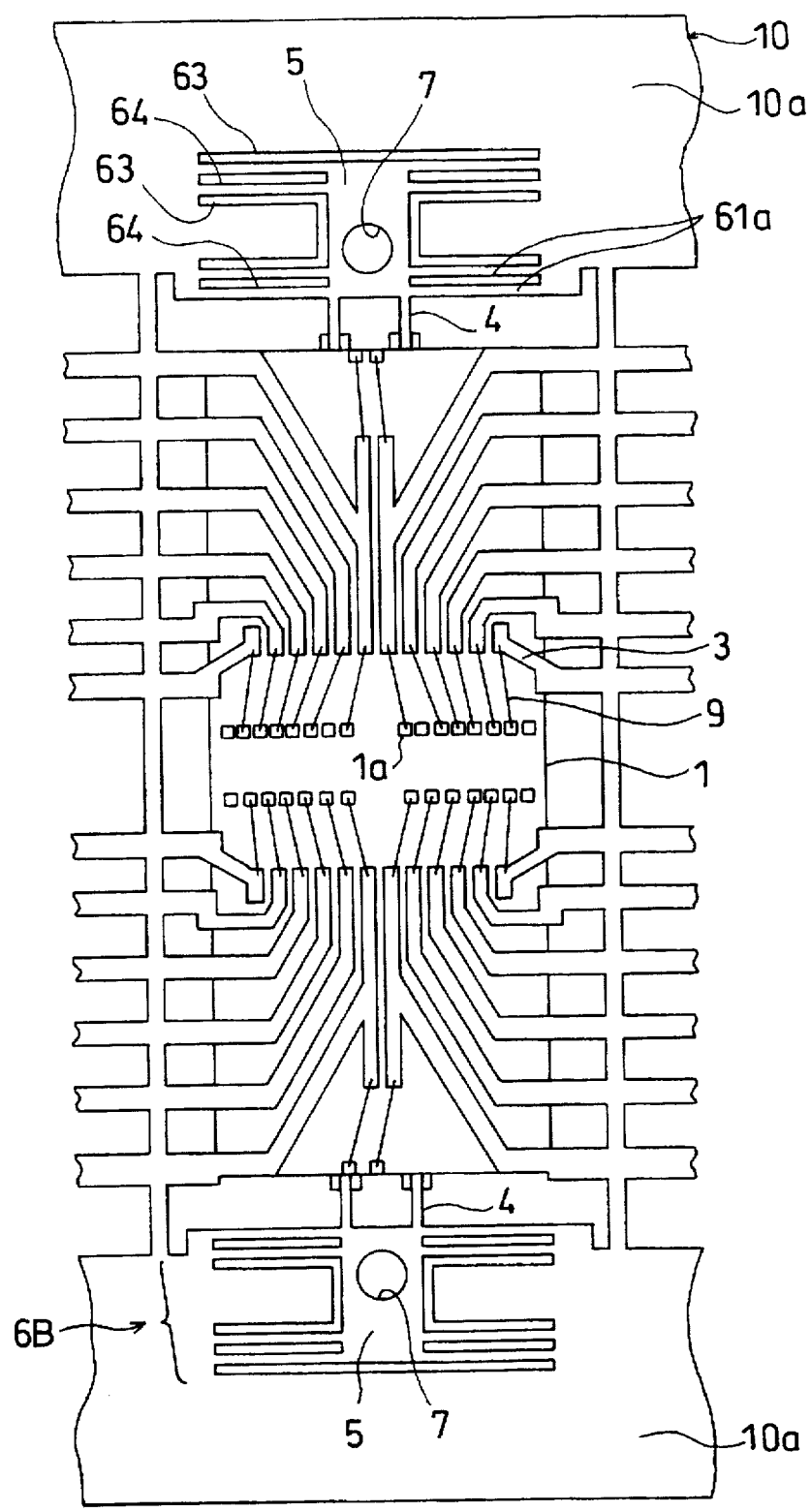
FIG. 8 is a plan view for showing the shape of a lead frame according to a third embodiment on which a semiconductor chip is fixed.

A third embodiment will now be described with reference to FIG. 8. FIG. 8 is a plan view of a lead frame of the third embodiment, in which a semiconductor chip is mounted.

In the lead frame 10 of this embodiment, a spring part 6B and a movable part 5 are disposed between each pair of supporting leads 4 and each outer frame 10a as in the first embodiment. In this lead frame 10, however, each spring part 6B includes eight spring leads 61a and 61b in total differently from the lead frame of the first embodiment. Specifically, two spring leads are formed each in front of, behind of, on the right side of and on the left side of the movable part 5. As a result, the plastic deformation of the spring leads 61a and 61b can be definitely prevented. Also, since the stress applied to each of the spring leads 61a and 61b can be equalized, the semiconductor chip 1 can be more stably fixed in a predetermined position by the supporting leads 4.

(Other embodiments)

Other embodiments will now be described with reference to FIGS. 9(a) through 9(e), 10(a) through 10(d), 11(a) through 11(e), 12(a) through 12(c), 13(a) through 13(d), 14 and 15.

FIGS. 9(a) through 9(e) show modifications of a supporting lead. The modification of FIG. 9(a) adopts two supporting leads 41 extending to be away from each Other toward their tip portions. The modification of FIG. 9(b) adopts two supporting leads 42 extending to be closer to each other toward their tip portions. These modifications of FIGS. 9(a) and 9(b) both have an advantage of an improved cushioning property.

Figure 9A:
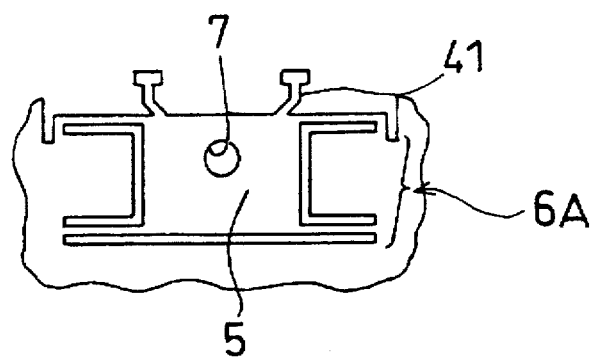
FIGS. 9(a) through 9(e) are partial plan views for showing modifications of a supporting lead in lead frames according to other embodiments.
Figure 9B:
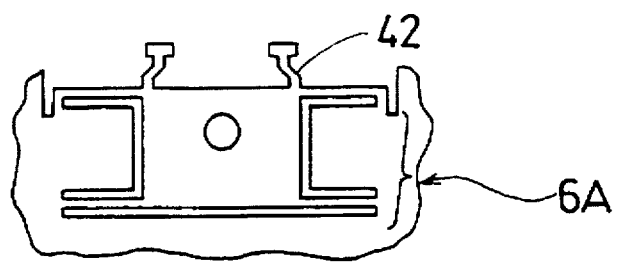
Figure 9C:
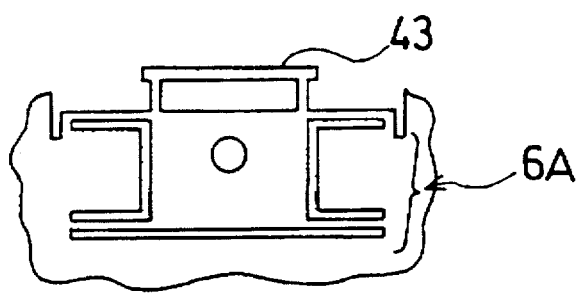

The modification of FIG. 9(c) adopts a supporting lead 43 in substantially a π-shape having two base portions extending from two portions and one combined tip portion. In this modification, an area of the supporting lead in contact with a semiconductor chip can be increased, resulting in an advantage of definitely preventing a damage of the semiconductor chip.

Figure 9D:
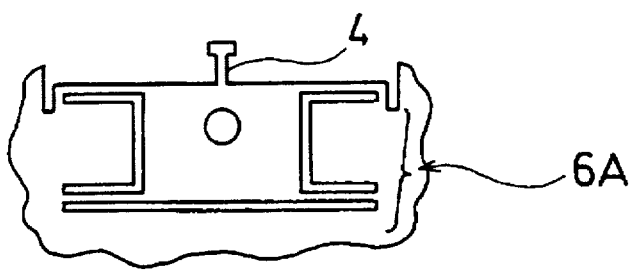
Figure 9E:
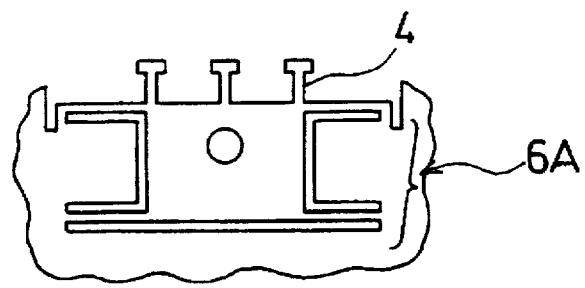
Figure 10A:
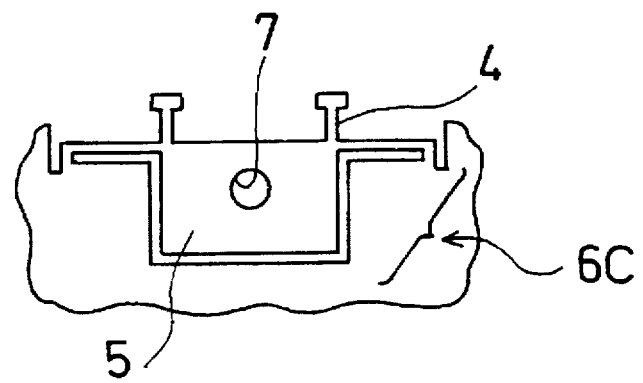
FIGS. 10(a) through 10(d) are partial plan views for showing modifications of a spring part in lead frames according to other embodiments.
Figure 10B:
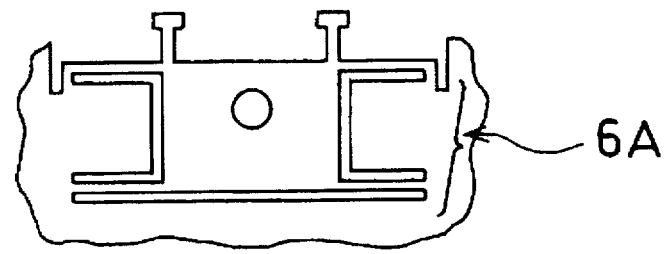
Figure 10C:
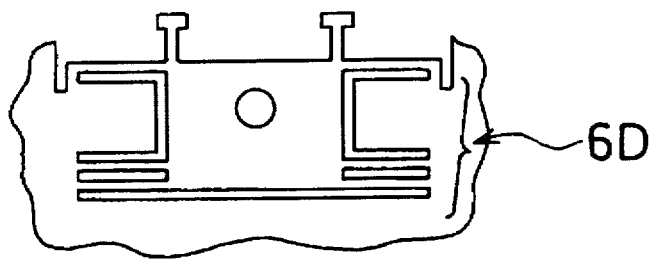
Figure 10D:
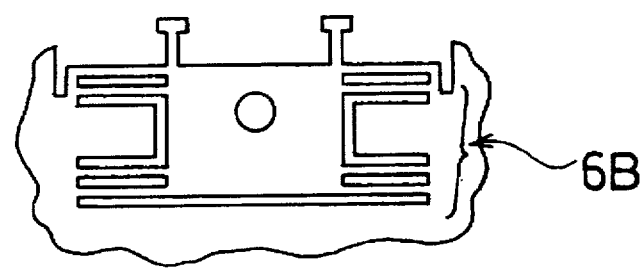
Figure 11A:
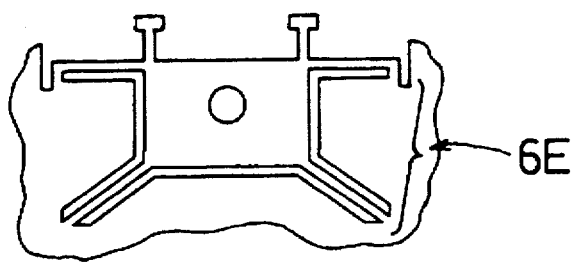
FIGS. 11(a) through 11(e) are partial plan views for showing other modifications of a spring part in lead frames according to other embodiments.
Figure 11B:
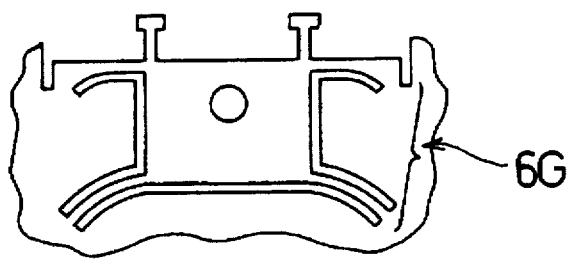
Figure 11C:
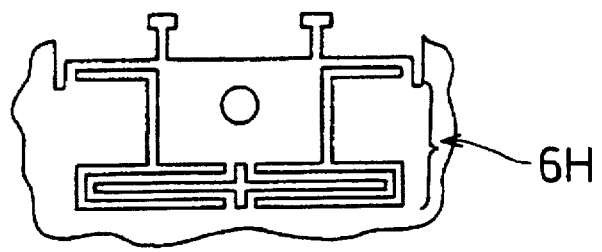
Figure 11D:
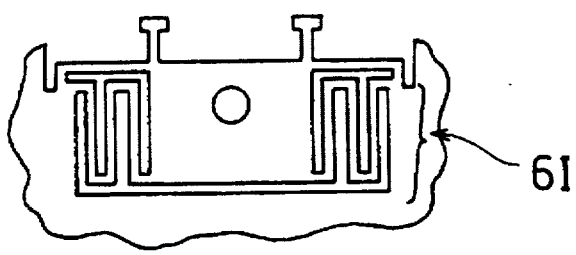
Figure 11E:
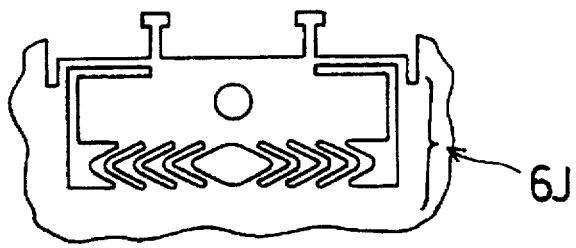

The modification of FIG. 9(d) adopts merely one supporting lead 4 having the same shape as that described in the aforementioned embodiments, and the modification of FIG. 9(e) adopts three supporting leads 4 each having the same shape as that described in the embodiments. The number of the supporting leads 4 is not limited to 1 through 3, but can be appropriately determined in consideration of a supporting force of the suspending leads in accordance with the type, etc. of a semiconductor device.

Next, FIGS. 10(a) through 10(d) show modifications of a spring part including spring leads extending in a direction perpendicular to the direction of the bias force, and the modifications respectively adopt, in this order, a spring part 6C including a pair of spring leads merely on the tip side (namely, the side closer to the semiconductor mounting region) of the movable part 5; a spring part 6A having the same structure as that described in the first and second embodiments including one pair of spring leads each on the tip side of and on the base side (namely, the side closer to the outer frame) of the movable part 5; a spring part 6D including a pair of spring leads on the tip side of the movable part 5 and two pairs of spring leads on the base side of the movable part 5; and a spring part 6B having the same structure as that described in the third embodiment including two pairs of spring leads each on the tip side of and on the base side of the movable part 5. Any of these modifications can be adopted, but the numbers of pairs of spring leads formed on the tip side and the base side of the movable part are preferably the same for balancing the stress as described above.

FIGS. 11(a) through 11(e) show modifications of a spring part in which the shape or extending direction of each spring lead is different from that described in the aforementioned embodiments. These modifications respectively adopt, in this order, a spring part 6E including a pair of spring leads linearly extending in a direction perpendicular to the direction of the bias force on the tip side of the movable part 5 and another pair of spring leads linearly extending in a direction diagonally crossing the direction of the bias force on the base side of the movable part 5; a spring part 6E including one pair of curved spring leads each on the tip side and on the base side of the movable part 5; a spring part 6H including a pair of spring leads linearly extending in the direction perpendicular to the direction of the bias force on the tip side of the movable part 5 and another pair of spring leads extending from two portions at the center of the movable part in the direction perpendicular to the direction of the bias force and being bent to extend in the reverse direction on the base side of the movable part 5; a spring part 6I including a pair of spring leads linearly extending in the direction perpendicular to the direction of the bias force on the tip side of the movable part 5 and another pair of spring leads extending in a zigzag manner on the base side of the movable part 5; and a spring part 6J including a pair of spring leads linearly extending in the direction perpendicular to the direction of the bias force on the tip side of the movable part 5 and four pairs of spring leads each formed in a dog-legged shape to be laterally symmetrically on the base side of the movable part 5.

The spring part can adopt various other modifications except for those shown in these drawings, and it goes without saying that the effects as described in the aforementioned embodiments can be exhibited by disposing the spring part 6 of any of the modifications between the base portion of the supporting lead 4 of the lead frame 10 and the main body of the lead frame 10. Also, it is not necessary to form a pair of spring leads on both sides of the center line, but a cantilever spring lead is adoptable.

Figure 12A:
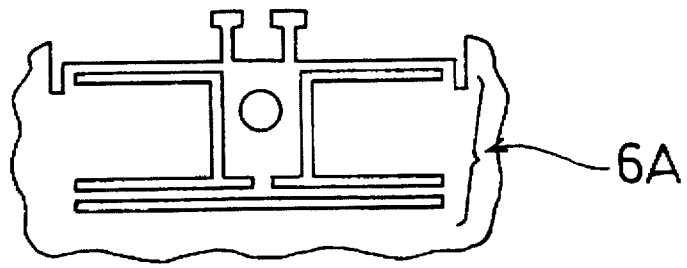
FIGS. 12(a) through 12(c) are partial plan views for showing modifications of a spring lead in lead frames according to other embodiments.
Figure 12B:
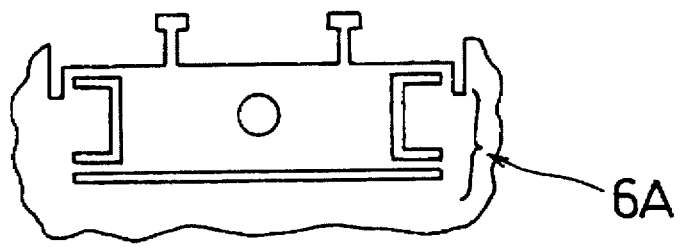
Figure 12C:
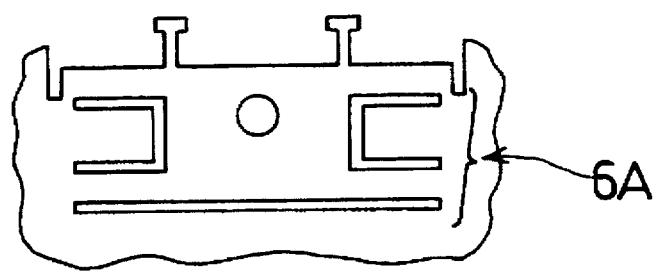

FIGS. 12(a) through 12(c) show modifications of the spring part 6A basically having the same structure as that described in the first and second embodiments but including a spring lead having a different length or width from that of the first and second embodiments. As described above, any of these modifications can be appropriately selected in order to adjust the spring modulus in accordance with a suitable supporting force of the spring part.

Figure 13A:
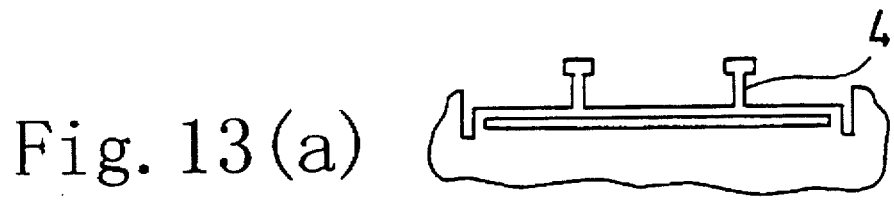
FIGS. 13(a) through 13(d) are partial plan views for showing modifications of an engaging portion in lead frames according to other embodiments.
Figure 13B:
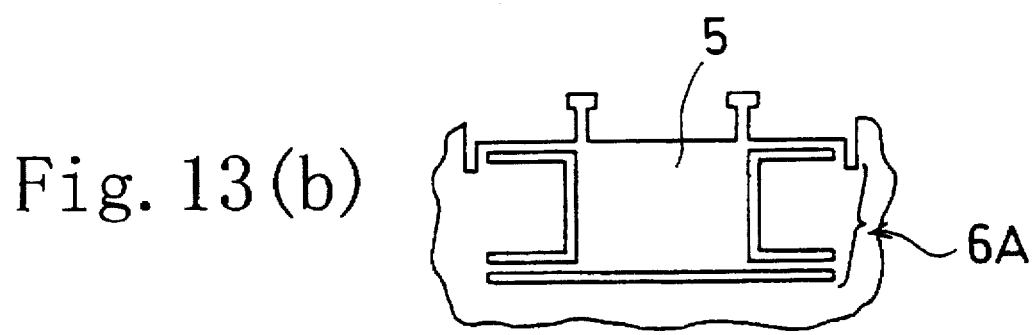
Figure 13C:
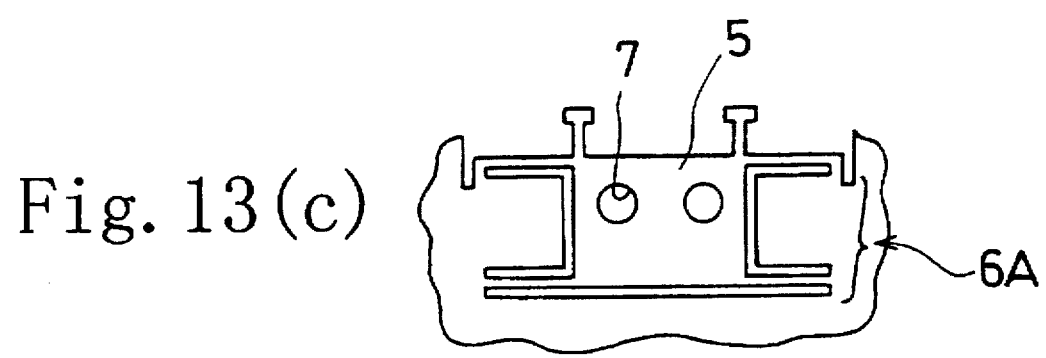
Figure 13D:
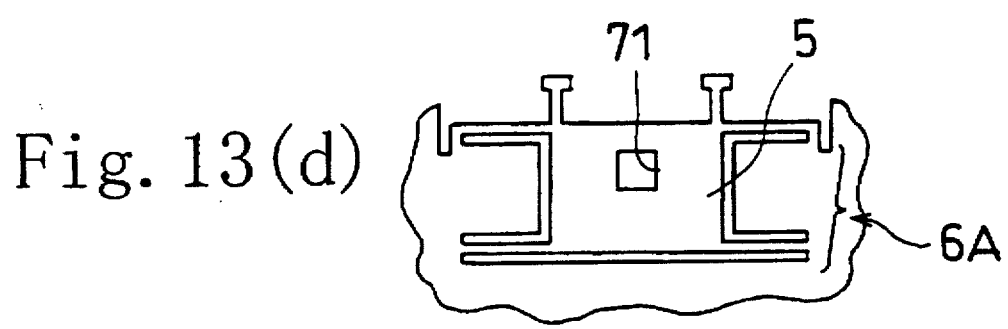

FIGS. 13(a) through 13(d) show modifications of the engaging portion to be engaged with a member such as a pin used for moving the movable part. In the modification of FIG. 13(a), one spring lead connected with the supporting leads 4 constitutes the movable part and the spring part, so that the tip side of the movable part can be engaged with a pin or the like. In the modification of FIG. 13(b), the spring part 6A having substantially the same structure as that of the first and second embodiments does not have an opening, and the tip side of the movable part 5 is engaged with a pin or the like. In the modification of FIG. 13(c), the movable part 5 is provided with two circular openings 7 as the engaging portion, and in the modification of FIG. 13(d), the movable part 5 is provided with a rectangular opening 71 as the engaging portion. The shape of the opening is not limited to the circle and the rectangle, but can be a triangle, an ellipse or any other shapes.

Figure 14:
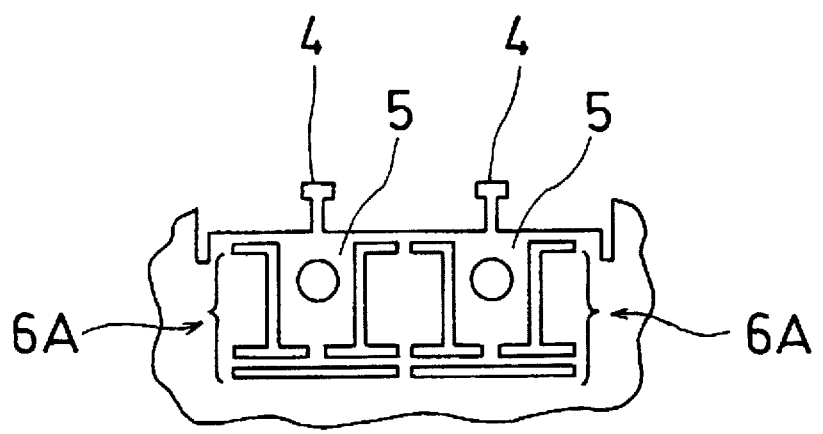
FIG. 14 is a partial plan view of a lead frame according to one of other embodiments including a separate movable part correspondingly to each supporting lead.

Also, FIG. 14 shows a modification in which each of two supporting leads 4 is provided with the spring part 6A and the movable part 5. In this modification, the respective spring parts 6A can be independently moved even when a semiconductor chip and the lead frame are inclined against each other on a plane or have slight irregularities. Therefore, a stable supporting force can be realized.

Figure 15:
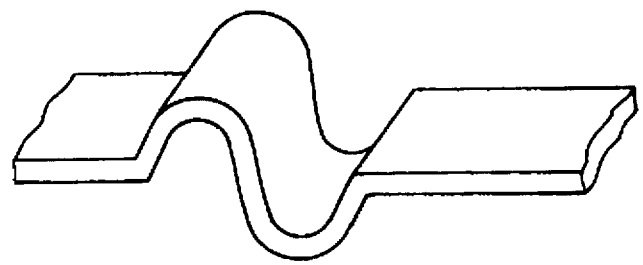
FIG. 15 is a perspective view for showing an exemplified solid spring part which can be interposed between a movable part and a lead frame main body in a lead frame according to one of other embodiments.
Figure 16:
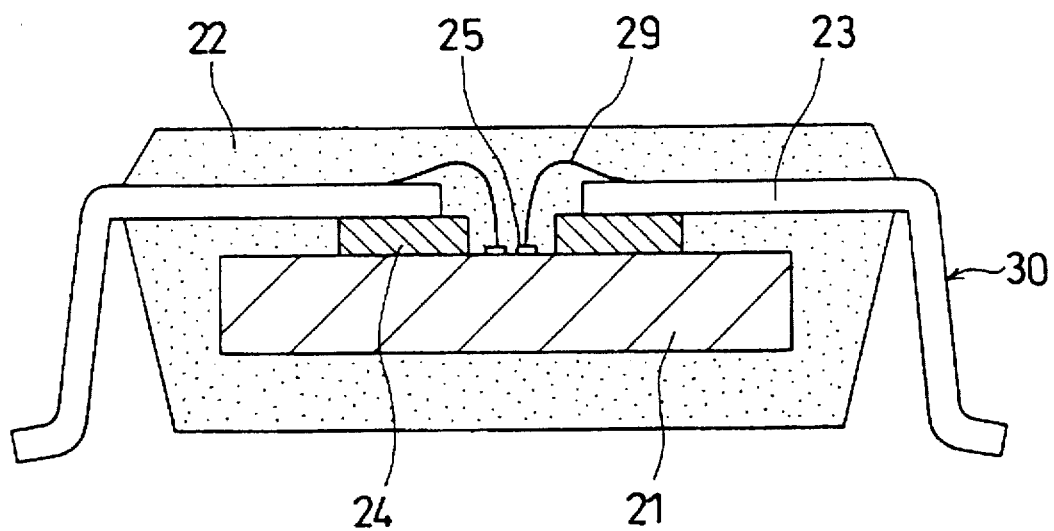
FIG. 16 is a sectional view for showing the structure of a conventional LOC package.
Figure 17A:
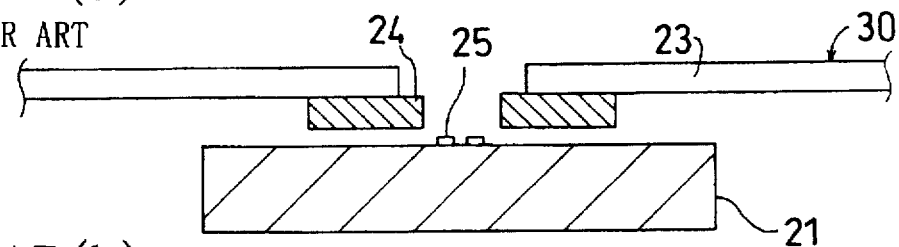
FIGS. 17(a) through 17(e) are sectional views for showing procedures for manufacturing the conventional LOC package.
Figure 17B:
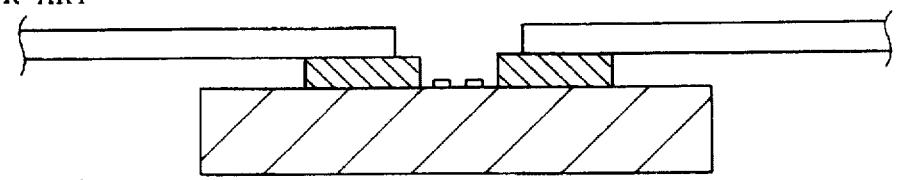
Figure 17C:
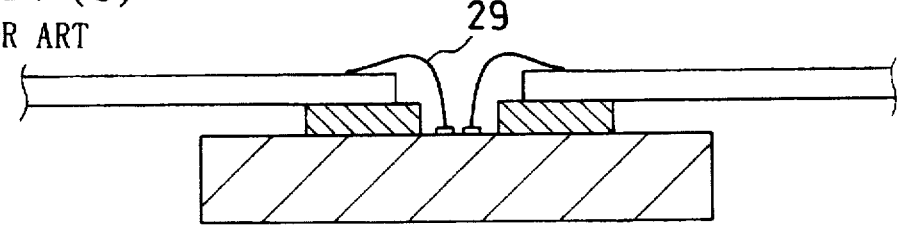
Figure 17D:
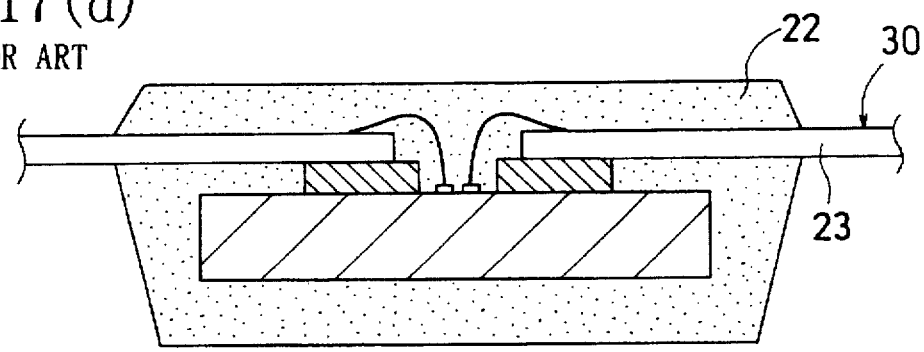
Figure 17E:
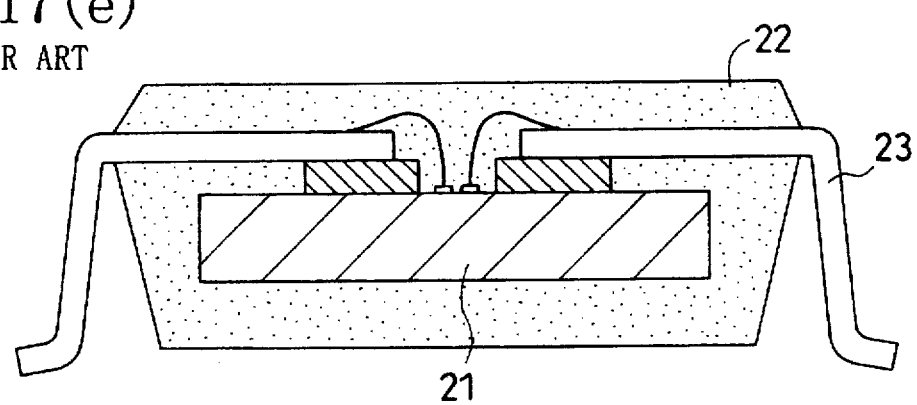

Furthermore, a portion of the lead frame which does not remain in the sealing resin, namely, a portion between the movable part 5 and the main body of the lead frame, can be provided with a solid spring as is shown in FIG. 15.

In any of the modifications shown in FIGS. 9(a) through 15, a semiconductor chip 1 can be mounted on a lead frame 10 in a package with the LOC structure without using a polyimide tape and without adopting a heating process. Accordingly, the cost for packaging can be decreased and the reliability can be improved. Moreover, since the conventional advantages of the LOC package can be taken over, the invention including these modifications is also advantageous in realizing a compact package for a large chip and a rapid operation speed, and decreasing power consumption of a device. In addition, the area of the chip can be decreased and the heat radiating property can be improved.

It is noted that the supporting lead 4 can be adhered to the side face of the semiconductor chip 1 by using an insulating resin, a metal with a low melting point, an adhesion tape or the like in order to more definitely fix the supporting lead 4 on the semiconductor chip 1.

In the aforementioned embodiments, each of the connecting leads 3 extends to the vicinity of the corresponding bonding pad 1a on the main face of the semiconductor chip 1. However, the tip portion of each connecting lead 3 can extend merely to the periphery of the semiconductor chip 1 as in a general package.

What is claimed is:

1. A lead frame for use in a resin sealed die-padless semiconductor package comprising:

a lead frame main body surrounding a semiconductor chip mounting region for mounting a semiconductor chip;

a plurality of connecting leads, each extending from said lead frame main body toward said semiconductor chip mounting region to be electrically connected with a part of said semiconductor chip;

a plurality of supporting leads each having a base portion connected with said lead frame main body and positioned out of a sealed area to be sealed by a resin, and a tip portion for clipping said semiconductor chip by butting against a side face of said semiconductor chip when said semiconductor chip is mounted;

a movable part disposed between at least one of said supporting leads and said lead frame main body relatively movably against said lead frame main body; and a spring part disposed between said movable part and said lead frame main body for elastically supporting said movable part and, when said movable part is shifted from a natural state thereof, for applying to said movable part a bias force in a direction reverse to movement of said movable part, wherein said tip portion of said supporting lead connected with said movable part is positioned within said semiconductor chip mounting region in the natural state, is movable to be positioned out of said semiconductor chip mounting region in accordance with the movement of said movable part, and is adoptable to support said semiconductor chip by using the bias force of said spring part by butting against the side face of said semiconductor chip when said semiconductor chip is mounted.

2. The lead frame of claim 1,
wherein said movable part is provided with an engaging portion to be engaged with a member for moving said movable part.

3. The lead frame of claim 2,
wherein, when said member for moving said movable part is a pin, said engaging portion is an opening to be engaged with said pin.

4. The lead frame of claim 1,
wherein said supporting leads are disposed at two opposing portions of said lead frame for clipping two opposing side faces of said semiconductor chip, and said movable part is disposed between said lead frame main body and said base portions of said supporting leads disposed at each of said two opposing portions.

5. The lead frame of claim 4,
wherein a plurality of said supporting leads are disposed at each of said opposing portions.

6. The lead frame of claim 1,
wherein said supporting leads are disposed at two opposing portions of said lead frame for clipping two opposing side faces of said semiconductor chip, and said movable part is disposed between said lead frame main body and said base portions of said supporting leads disposed at one of said two opposing portions, with no movable part disposed between said lead frame main body and said base portions of said supporting leads disposed at the other of said two opposing portions, and said tip portions of said supporting leads disposed at the other of said two opposing portions accord with one end of said semiconductor chip mounting region.

7. The lead frame of claim 6,
wherein a plurality of said supporting leads are disposed at each of said two opposing portions.

8. The lead frame of claim 1,
wherein said tip portion of each of said supporting leads is bent to lie along the side face of said semiconductor chip.

9. The lead frame of claim 1,
wherein said supporting leads are disposed in an upstream area and a downstream area of a flow of said resin in a resin sealing process for sandwiching said semiconductor chip mounting region, and
said spring part has a structure for applying the bias force in a direction substantially parallel to a direction of the flow of said resin.

10. The lead frame of claim 1,
wherein said spring part includes a plurality of linear spring leads extending in a parallel direction to each other.

11. The lead frame of claim 10,
wherein said spring leads extend in a direction perpendicular to a direction of the bias force of said spring part.

12. The lead frame of claim 10,
wherein said spring leads are disposed between said movable part and said lead frame main body, on both sides of a center line of said semiconductor chip mounting region extending in the same direction as said supporting leads, symmetrically to each other about the center line.

13. The lead frame of claim 10,
wherein said spring leads are disposed at one portion of said movable part closer to said supporting lead and another portion closer to said lead frame main body, symmetrically to each other about a line perpendicular to a center line of said semiconductor chip mounting region extending in the same direction as said supporting leads.

14. The lead frame of claim 1,
wherein said spring part is formed by a slit pattern formed in said lead frame.

15. A method of mounting a semiconductor chip comprising the steps of:
preparing a semiconductor chip;
preparing a lead frame including a plurality of connecting leads extending from a lead frame main body toward a semiconductor chip mounting region, a plurality of supporting leads each having a base portion connected with said lead frame main body and a tip portion extending toward said semiconductor chip mounting region, a movable part disposed between at least one of said supporting leads and said lead frame main body relatively movably against said lead frame main body, and a spring part disposed between said movable part and said lead frame main body for elastically supporting said movable part, and when said movable part is shifted from a natural state thereof, for applying to said movable part a bias force in a direction reverse to movement of said movable part;
positioning said tip portion of said supporting lead connected with said movable part out of said semiconductor chip mounting region by moving said movable part of said lead frame in a direction away from said semiconductor chip mounting region;
with said tip portion of said supporting lead connected with said movable part positioned out of said semiconductor chip mounting region, setting said semiconductor chip in said semiconductor chip mounting region to be disposed below said connecting leads, and aligning said semiconductor chip and said lead frame main body for setting a vertical distance between said connecting leads and a main face of said semiconductor chip within a predetermined range;
supporting said semiconductor chip by using the bias force of said spring part applied to said tip portion of said supporting lead by moving said supporting lead connected with said movable part in accordance with the bias force of said spring part until said tip portion of said supporting lead butts against a side face of said semiconductor chip;
with said semiconductor chip supported by said supporting lead, electrically connecting said connecting leads with a part of said semiconductor chip and conducting resin sealing; and
cutting off a part of each of said supporting leads extending from a predetermined position between said tip portion and said base portion toward said lead frame main body, a part of each of said connecting leads closer to said lead frame main body, said movable part, said spring part and said lead frame main body to be separated from a sealed part.

16. The method of mounting a semiconductor chip of claim 15, wherein said movable part is provided with an opening in the step of preparing said lead frame, in the step of positioning said tip portion of said supporting lead by moving said movable part, a pin is inserted through said opening and said pin is moved in the direction away from said semiconductor chip mounting region by supplying said inserted pin with a reaction force against the bias force of said spring part, and in the step of aligning said semiconductor chip and said lead frame main body, the reaction force against the bias force of said spring part is released from said pin, and said pin is pulled out of said opening after said tip portion of said supporting lead butts against the side face of said semiconductor chip.

* * * * *